(12) United States Patent
Bae

(10) Patent No.: US 12,275,350 B2
(45) Date of Patent: Apr. 15, 2025

(54) PHYSICAL VAPOR DEPOSITION COATING LAYER COMBINATION FOR COLOR DEVELOPMENT ENABLING LASER ETCHING WITHOUT BACKLIT COLOR DISRUPTION

(71) Applicant: GM Global Technology Operations LLC, Detroit, MI (US)

(72) Inventor: Woo-Sung Bae, Northville, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 435 days.

(21) Appl. No.: 17/719,919

(22) Filed: Apr. 13, 2022

(65) Prior Publication Data

US 2023/0331148 A1    Oct. 19, 2023

(51) Int. Cl.
  *C23C 14/02* (2006.01)
  *B60Q 3/60* (2017.01)
  *C23C 14/58* (2006.01)

(52) U.S. Cl.
  CPC ............. *B60Q 3/60* (2017.02); *C23C 14/024* (2013.01); *C23C 14/5873* (2013.01)

(58) Field of Classification Search
  None
  See application file for complete search history.

(56) References Cited

U.S. PATENT DOCUMENTS

2018/0111546 A1* 4/2018 Salter .................. B60Q 3/20
2021/0387570 A1* 12/2021 Piles Guillem ........ B44C 5/04

OTHER PUBLICATIONS

P. Uglum, The Future of Metallic Finishes on Plastic in the Automotive Industry, May 5, 2020, 5 pages. Uglum Consulting, LLC.

* cited by examiner

*Primary Examiner* — Elizabeth Collister
(74) *Attorney, Agent, or Firm* — Vivacqua Crane, PLLC

(57) ABSTRACT

The present disclosure is directed to an automotive component and method of finishing such component including a polymer substrate, a tinted primer disposed over a first surface of the polymer substrate, a semi-transparent metallic coating disposed over the tinted primer. The semi-transparent metallic coating and tinted primer define at least one discontinuity. The automotive component further includes a top-coat disposed over the semi-transparent metallic coating and fills in the discontinuity. In aspects, the automotive component is back-lit and includes a light emitting source optically coupled to a second surface of the polymer substrate.

20 Claims, 3 Drawing Sheets

finishes, are used in automotive design for various vehicle components including grilles, door handles, interior and exterior accents, interior and exterior emblems, and other interior and exterior features. Physical vapor deposition is one technique for forming a finish on various substrates, including polymer substrates. During physical vapor deposition a source material is evaporated and deposited on the substrate surfaces to form a vapor deposited coating. After vapor deposition, a top-coating may be applied over the vapor deposited coating. Varying the source material allows for variation in the color of the vapor deposited coatings and further alterations in color may be achieved using tinted top-coatings.

PHYSICAL VAPOR DEPOSITION COATING LAYER COMBINATION FOR COLOR DEVELOPMENT ENABLING LASER ETCHING WITHOUT BACKLIT COLOR DISRUPTION

INTRODUCTION

Finishes, such as metallic finishes, are used in automotive design for various vehicle components including grilles, door handles, interior and exterior accents, interior and exterior emblems, and other interior and exterior features. Physical vapor deposition is one technique for forming a finish on various substrates, including polymer substrates. During physical vapor deposition a source material is evaporated and deposited on the substrate surfaces to form a vapor deposited coating. After vapor deposition, a top-coating may be applied over the vapor deposited coating. Varying the source material allows for variation in the color of the vapor deposited coatings and further alterations in color may be achieved using tinted top-coatings.

In some applications, the coated substrates are backlit. To allow light to pass through the substrate and metallic finish, the vapor deposited coating may be etched in selected locations. However, the pigments in the top-coating may affect the transmissibility of light through the top-coating and hinder the use of the coated substrates in backlit applications. The transmissibility of light through the tinted top-coating may increase as the thickness of the tinted top-coating increases, particularly where the top-coating fills the etched regions of the vapor deposited coating.

Thus, while current finishes achieve their intended purpose, there is a need for a new and improved finishes and methods of forming a finish on substrate surface.

SUMMARY

According to several aspect, the present disclosure relates to an automotive component. The automotive component includes a polymer substrate, a tinted primer disposed over a first surface of the polymer substrate, a semi-transparent metallic coating disposed over the tinted primer. The semi-transparent metallic coating and tinted primer define at least one discontinuity. The automotive component also includes a top-coat disposed over the semi-transparent metallic coating and fills in the discontinuity.

In aspects of the above, the tinted primer exhibits a thickness in a range of 1 micrometer to 25 micrometers.

In further aspects of the above, the semi-transparent metallic coating exhibits a thickness in a range of 100 nanometers to 200 nanometers.

In further aspects of the above, the top-coat exhibits a thickness in a range of 20 micrometers to 50 micrometers.

In further aspects of the above, the top-coat is clear.

In further aspects of the above, the top-coat is tinted.

In yet further aspects of the above, the tinted primer exhibits a thickness in a range of 1 micrometer to 25 micrometers, the semi-transparent metallic coating exhibits a thickness in a range of 100 nanometers to 200 nanometers, and the top-coat exhibits a thickness in a range of 20 micrometers to 50 micrometers.

In additional aspects of the above, the substrate is transparent.

In additional aspects of the above, the substrate is polycarbonate.

In additional aspects of the above, the top-coat is clear.

In additional aspects of the above, the top-coat is tinted.

According to several aspects, the present disclosure relates to a backlit automotive component. The backlit automotive component includes a polymer substrate, a tinted primer disposed over a first surface of the polymer substrate, a semi-transparent metallic coating disposed over the tinted primer. The semi-transparent metallic coating and tinted primer define at least one discontinuity. The backlit automotive component also includes a top-coat disposed over the semi-transparent metallic coating and fills in the discontinuity. The backlit automotive component also includes a light emitting source optically coupled to a second surface of the polymer substrate.

In aspects of the above, the tinted primer exhibits a thickness in a range of 1 micrometer to 25 micrometers, the semi-transparent metallic coating exhibits a thickness in a range of 100 nanometers to 200 nanometers, and the top-coat exhibits a thickness in a range of 20 micrometers to 50 micrometers.

In further aspects of the above, the substrate is polycarbonate.

In yet further aspects of the above, the polymer substrate defines one or more of the following components: a button, a switch, and a knob.

In yet further aspects of the above, the polymer substrate defines one or more of the following: a dash panel, a gauge face, a door sill, and a bezel.

In yet further aspects of the above, the polymer substrate defines one or more of the following exterior components: a grill, an emblem, a door edge guard, and an exhaust tip.

According to several aspects, the present disclosure e relates to a method of finishing an automotive component. The method includes applying a tinted primer over a transparent polymer substrate, depositing a semi-transparent metallic coating over the tinted primer by physical vapor deposition, etching at least one discontinuity in the semi-transparent metallic coating and tinted primer, and applying a top-coat over the semi-transparent metallic coating and tinted primer.

In further aspects, applying the tinted primer includes spray coating the tinted primer on the polymer substrate.

In further aspects, applying the top-coat includes spray coating the top-coat on the metallic coating.

BRIEF DESCRIPTION OF THE DRAWINGS

The drawings described herein are for illustration purposes only and are not intended to limit the scope of the present disclosure in any way.

DETAILED DESCRIPTION

The present disclosure relates to a physical vapor deposition coating layer combination for color development enabling laser etching without backlit color disruption. Various automotive components, such as buttons, switches, knobs, dash panels, and other interior and exterior panels, are backlit allowing light to pass through portions of the components to provide various indicia and other visual effects. To provide a backlit effect, the coating layer provided on the substrate is etched and a top-coat is then applied to protect the etched coating layer. By tinting the top-coat layer or altering the source material for the metallic coating, the color of the component may be altered. However, some colorants used to tint the top-coat obscure or negate the backlit effect, particularly in the etched backlit regions where the top-coat layer fills in the etched regions and is relatively thick. The present disclosure alters the color of the automotive component by tinting the primer layer in addition to, in some aspects, adjusting the metallic coating.

Figure 1:
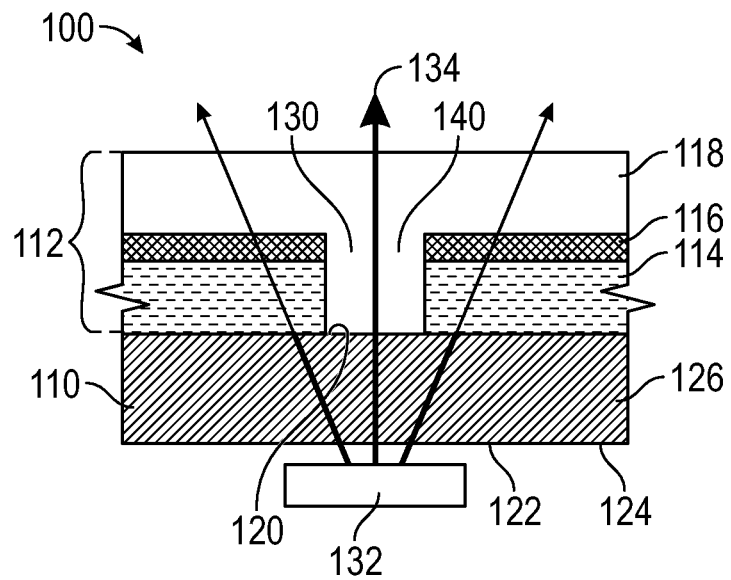
FIG. 1 is a cross-section of an automotive component including backlit indicia according to an embodiment of the present disclosure.

FIG. 1 illustrates an automotive component 100 including a substrate 110 and a metallic finish 112. The metallic finish 112 includes a primer 114, a semi-transparent metallic coating 116, and a top-coat 118. Semi-transparent is understood herein as allowing a portion, and in aspects only a portion, of light incident on the coating to pass through with or without scattering of light internally or at the surfaces of the coating. The semi-transparent metallic coating 116 and primer 114 are etched, exposing a first surface 120 of the polymer substrate 110 and defining a discontinuity 130 in the primer 114 and semi-transparent metallic coating 116, which is filled in by the top-coat 118. Light 134, emitted from a light emitting source 132, illuminates a second surface 122 of the polymer substrate 110 hidden from view, such as the rear 124 or side 126 of the polymer substrate 110, and is visible through the discontinuity 130 and the first surface 120 to provide a backlit feature. The thickness of the arrows in FIG. 1, as well as in FIGS. 3 and 4, indicates the relative light intensity as the light 134 passes through the automotive component 100 with the metallic finish 112. The polymer substrate 110 acts as, or includes, a light guide and is optically coupled to a light emitting source 132, such as a light emitting diode, a halogen light, an incandescent light, or fluorescent light. Optical coupling occurs through the illumination of the second surface 122 of the polymer substrate 110 by the light emitting source 132, which in aspects, may be facilitated by a wave guide such as optical fiber or a hollow light guide.

Figure 2A:
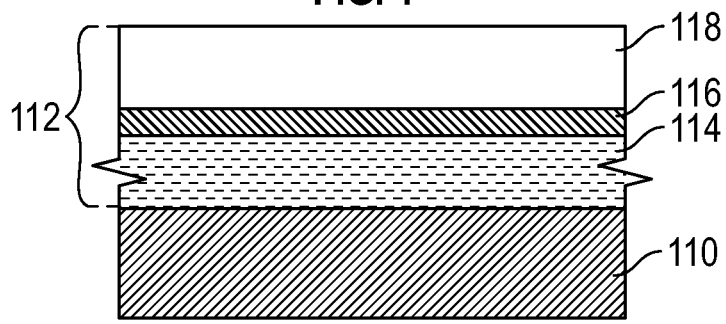
FIG. 2A is a cross-section of an automotive component including a semi-transparent metallic coating of a first color according to an embodiment of the present disclosure.
Figure 2B:
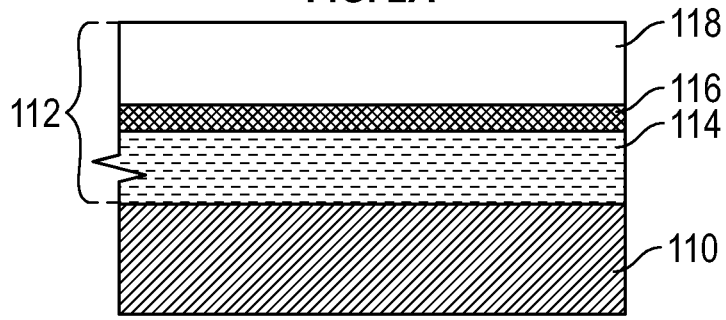
FIG. 2B is a cross-section of an automotive component including a semi-transparent metallic coating of a second color according to an embodiment of the present disclosure.
Figure 2C:
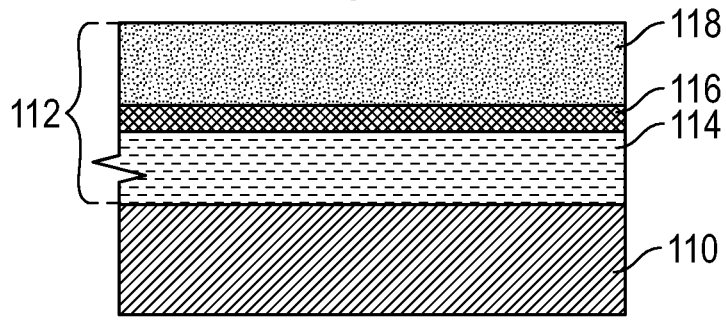
FIG. 2C is a cross-section of an automotive component including a semi-transparent metallic coating of a second color and a tinted top-coat according to an embodiment of the present disclosure.
Figure 3:
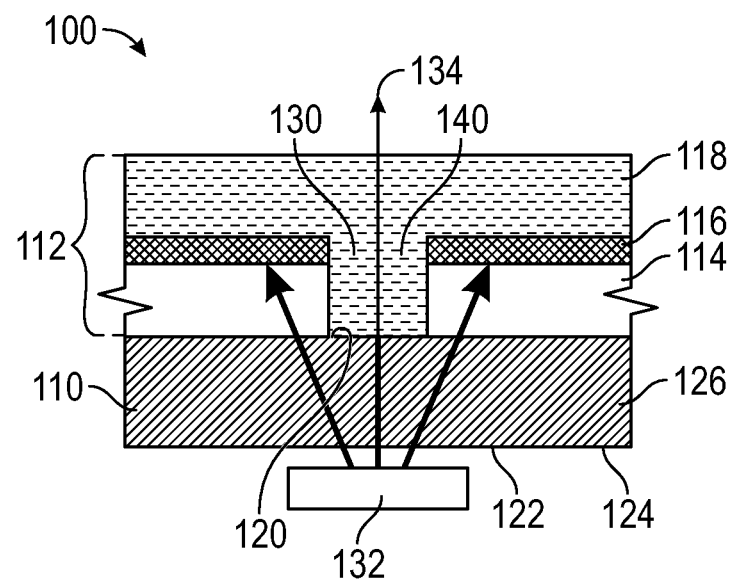
FIG. 3 is a cross-section of an automotive component including backlit indicia.
Figure 4:
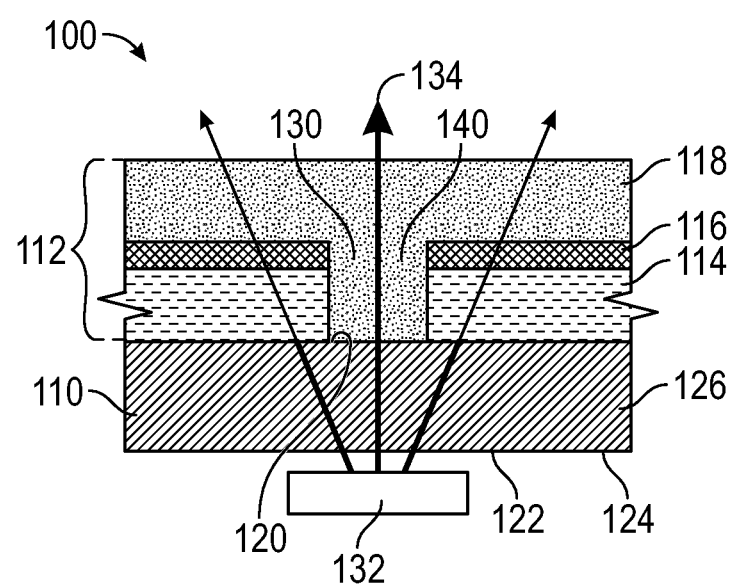
FIG. 4 is a cross-section of an automotive component including backlit indicia according to an embodiment of the present disclosure.

To alter the color of the metallic finish 112, the source material for the semi-transparent metallic coating 116 may be changed, as illustrated in FIGS. 2A and 2B. The variation in color imparted by altering the source materials is limited to the source materials that may be vapor deposited through physical vapor deposition. Further alterations in color have been made by tinting the top-coat 118, as illustrated in FIG. 3. However, as noted above, a top-coat 118 tinted with light absorbing or light reflecting pigments, including carbon black or titanium dioxide, reduces the amount of light 134 that can pass through the top-coat 118, particularly in the thicker portion 140 of the top-coat 118 that fills the discontinuity 130, negating the backlit effect. By tinting the primer 114, which is etched, along with providing a semi-transparent metallic coating 116, as illustrated in FIG. 1, the color of the metallic finish 112 is altered without negatively impacting the light 134 passing through the discontinuity 130 forming the backlit feature. If further alteration in color is still desired, then the top-coat 118 may be tinted with a pigment or dye that is selected to provide little interruption of the passage of light 134, even at the thicknesses of the top-coat 118 found in the discontinuity 130, as illustrated in FIGS. 2C and 4.

In any of the above aspects, the polymer substrate 110 is formed from a polymer material such as polycarbonate. Alternative polymer materials include, for example, polyethylene terephthalate, polymethylmethacrylate, polyethylene, ionomer resin, styrene methyl methacrylate, etc. In further aspects, the polymer substrate 110 includes polymers such as polyester, epoxy, polymethyl methacrylate, or blends of polyphenylene oxide or polyphenylene ether blended with polystyrene. The polymer substrate 110 exhibits any suitable thickness to provide structural integrity to the automotive component 100. The polymer substrate 110 is also transparent, allowing light, or at least a portion thereof, incident on the polymer substrate 110 to pass through the polymer substrate 110 with or without scattering of light internally or at the surfaces of the polymer substrate 110.

The primer 114 is disposed over the polymer substrate 110. In aspects, the primer 114 is coated directly onto the polymer substrate 110 by spray coating. As an alternative to spray coating, other coating methods may be used such as spin coating or dip coating. The primer 114 exhibits a thickness in the range of 1 micrometer to 25 micrometers, including all values and ranges therein, such as 10 micrometers to 15 micrometers. The primer 114 is a single component primer or, alternatively, a two component primer. In aspects, the primer 114 includes, for example, polyurethane, melamine, epoxies, or polyesters. To provide variation in color, the primer 114 is tinted with pigments or dyes, including, but not limited to, carbon black, titanium dioxide, etc. The primer 114 may also include one or more solvents and other additives. The primer 114 allows at least a portion of incident light on the primer 114 to pass through the primer 114 at the applied thicknesses.

The semi-transparent metallic coating 116 is disposed over the primer 114. In aspects, the semi-transparent metallic coating 116 is coated directly onto the primer 114 through a vapor deposition process, such as a physical vapor deposition process including magnetron sputtering, electron-beam, evaporative deposition, or sputter deposition. The source material for the coating is selected from one or more of aluminum, chrome, gold, titanium, zirconium, copper, nickel, titanium nitride, aluminum titanium nitride, titanium carbonitride, chromium nitride, zirconium nitride and aluminum titanium chromium nitride.

The semi-transparent metallic coating 116 allows a portion of incident light to pass through at the applied thickness. The transparency of the coating allows for the color imparted by the primer to pass through the film. In aspects, the semi-transparent metallic coating 116 exhibits a thickness in the range of 100 nanometers to 200 nanometers including all values and ranges therein.

The top-coat 118 is disposed over the semi-transparent metallic coating 116 and the primer 114. In aspects, the top-coat 118 is coated directly on the semi-transparent metallic coating 116 by spray coating. As an alternative to spray coating, other coating methods may be used such as spin coating or dip coating. The top-coat 118 exhibits a thickness in the range of 20 micrometers to 50 micrometers, including all values and ranges therein, such as 25 micrometers to 35 micrometers or 30 micrometers. The top-coat 118 includes, for example, acrylate. Alternatively, the top-coat 118 may include polyesters, melamine, or polyurethane.

In particular aspects, the top-coat 118 is clear, i.e., it is transparent a allowing light, or at least a portion thereof, incident on the top-coat 118, to pass through the top-coat 118, with or without scattering of light internally or at the surfaces of the coating and does not include pigments or tints. In alternative aspects, to provide additional variation in the color of the metallic finish 112, the top-coat 118 is tinted with pigments or dyes that allows at least a portion of incident light to pass through at the applied thicknesses.

The various layers of the polymer substrate 110 and metallic finish 112 provide sufficient transparency to allow at least a portion light incident on the second surface 122 of the substrate 110 to be visible at the first surface 120 of the substrate through the etched locations, i.e., discontinuities of the automotive component 100 as well as partially visible, in some aspects, through the metallic finish 112.

Figure 5:
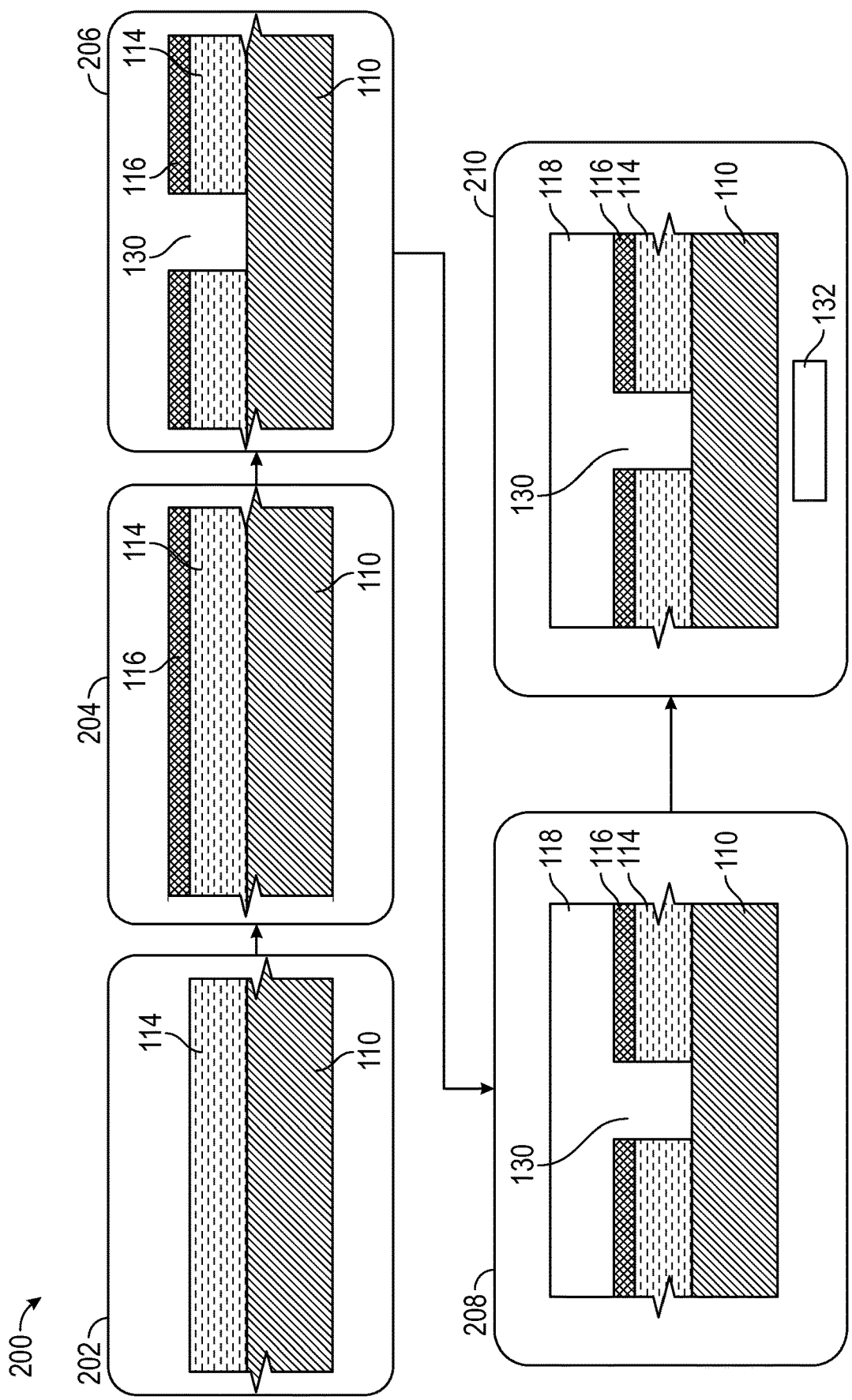
FIG. 5 is a schematic of a method of finishing an automotive component including backlit indicia according to an embodiment of the present disclosure.

FIG. 5 illustrates a method 200 of building-up the metallic finish 112 on the polymer substrate 110 to provide an automotive component 100 with backlit features. At block 202, the primer 114 is applied to the polymer substrate 110 using the processes described above. Then, at block 204, the semi-transparent metallic coating 116 is applied to the primer 114. At block 206, the primer 114 and semi-transparent metallic coating 116 are etched to define openings or discontinuities 130 in the primer 114 and semi-transparent metallic coating 116, exposing the polymer substrate 110. Etching is performed by laser etching, or alternatively may be performed by chemical etching. The etched regions are used to define indicia, characters, patterns, or other artwork on the exposed first surfaces 120. Once the primer 114 and semi-transparent metallic coating 116 are etched, at block 208 the top-coat 118 is applied over the polymer substrate 110, primer 114 and semi-transparent metallic coating 116. The top-coat 118 fills in the discontinuities 130. At block 210, the automotive component 100 is assembled with a light emitting source 132.

The automotive component 100, including the backlit feature may be used in a number of vehicle applications both interior and exterior. For example, in interior uses, the polymer substrate 110 defines one or more of the following components: a button, a switch, and a knob. In other interior uses, the polymer substrate 110 defines one or more of the following: a dash panel, a gauge face, a door sill, and a bezel. In exterior uses, polymer substrate 110 defines one or more of the following exterior components: a grill, an emblem, a door edge guard, and an exhaust tip. The polymer substrate 110 may be formed into the desired component using a suitable polymer processing method such as injection molding, extrusion, compression molding, etc.

In the claims and specification, certain elements are designated as "first," "second," etc. These are arbitrary designations intended to be consistent only in the section in which they appear, i.e., the specification or the claims or the summary, and are not necessarily consistent between the specification, the claims, and the summary. In that sense they are not intended to limit the elements in any way and a "second" element labeled as such in the claim may or may not refer to a "second" element labeled as such in the specification. Instead, the elements are distinguishable by their disposition, description, connections, and function.

The automotive components of the present disclosure and method of forming these components offer several advantages. These advantages may include, for example, retaining the ability to color a backlit automotive component without interfering or negating the backlighting effect. These advantages further include increased versatility in the use and application of physical vapor deposition of metallic coatings in automotive applications.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. An automotive component, comprising:
   a polymer substrate;
   a tinted primer disposed over a first surface of the polymer substrate;
   a semi-transparent metallic coating disposed over the tinted primer, wherein the semi-transparent metallic coating and tinted primer define at least one discontinuity; and
   a top-coat disposed over the semi-transparent metallic coating fills in the discontinuity and contacts the polymer substrate.

2. The automotive component of claim 1, wherein the tinted primer exhibits a thickness in a range of 1 micrometer to 25 micrometers.

3. The automotive component of claim 1, wherein the semi-transparent metallic coating exhibits a thickness in a range of 100 nanometers to 200 nanometers.

4. The automotive component of claim 1, wherein the top-coat exhibits a thickness in a range of 20 micrometers to 50 micrometers.

5. The automotive component of claim 1, wherein the top-coat is clear.

6. The automotive component of claim 1, wherein the top-coat is tinted.

7. The automotive component of claim 1, wherein the tinted primer exhibits a thickness in a range of 1 micrometer to 25 micrometers, the semi-transparent metallic coating exhibits a thickness in a range of 100 nanometers to 200 nanometers, and the top-coat exhibits a thickness in a range of 20 micrometers to 50 micrometers.

8. The automotive component of claim 7, wherein the substrate is transparent.

9. The automotive component of claim 8, wherein the substrate is polycarbonate.

10. The automotive component of claim 8, wherein the top-coat is clear.

11. The automotive component of claim 8, wherein the top-coat is tinted.

12. A backlit automotive component, comprising:
    a polymer substrate;
    a tinted primer disposed over a first surface of the polymer substrate;
    a semi-transparent metallic coating disposed over the tinted primer, wherein the semi-transparent metallic coating and tinted primer define at least one discontinuity;
    a top-coat disposed over the metallic coating, wherein the top-coat fills in the discontinuity and contacts the polymer substrate; and
    a light emitting source optically coupled to a second surface of the polymer substrate.

13. The backlit automotive component of claim 12, wherein the tinted primer exhibits a thickness in a range of 1 micrometer to 25 micrometers, the semi-transparent metallic coating exhibits a thickness in a range of 100 nanometers to 200 nanometers, and the top-coat exhibits a thickness in a range of 20 micrometers to 50 micrometers.

14. The backlit automotive component of claim 13, wherein the substrate is polycarbonate.

15. The automotive component of claim 12, wherein the polymer substrate defines one or more of the following components: a button, a switch, and a knob.

16. The automotive component of claim 12, wherein the polymer substrate defines one or more of the following: a dash panel, a gauge face, a door sill, and a bezel.

17. The automotive component of claim 12, wherein the polymer substrate defines one or more of the following exterior components: a grill, an emblem, a door edge guard, and an exhaust tip.

18. A method of finishing an automotive component, comprising:
   applying a tinted primer over a first surface of a transparent polymer substrate;
   depositing a semi-transparent metallic coating over the tinted primer by physical vapor deposition;
   etching at least one discontinuity in the semi-transparent metallic coating and tinted primer exposing the transparent polymer substrate; and
   applying a top-coat over the semi-transparent metallic coating and tinted primer, wherein the top-coat fills in the discontinuity and contacts the transparent polymer substrate.

19. The method of claim 18, wherein applying the tinted primer comprises spray coating the tinted primer on the polymer substrate.

20. The method of claim 18, wherein applying the top-coat comprises spray coating the top-coat on the metallic coating.

* * * * *